(12) United States Patent
Okumura et al.

(10) Patent No.: US 6,864,640 B2
(45) Date of Patent: Mar. 8, 2005

(54) PLASMA PROCESSING METHOD AND APPARATUS THEREOF

(75) Inventors: Tomohiro Okumura, Kadoma (JP); Yukihiro Maegawa, Ibaraki (JP); Izuru Matsuda, Ibaraki (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/918,823

(22) Filed: Aug. 1, 2001

(65) Prior Publication Data

US 2002/0047541 A1 Apr. 25, 2002

(30) Foreign Application Priority Data

Aug. 4, 2000 (JP) .................................... 2000-237083

(51) Int. Cl.[7] .............................................. G09G 3/10
(52) U.S. Cl. ............................ 315/169.4; 315/111.21
(58) Field of Search ......................... 315/111.21, 169.2, 315/169.3, 169.4

(56) References Cited

U.S. PATENT DOCUMENTS

| | | | | |
|---|---|---|---|---|
| 5,576,593 A | * | 11/1996 | Schultheiss et al. | ... 313/231.31 |
| 5,868,848 A | * | 2/1999 | Tsukamoto | ............... 118/23 E |
| 5,907,221 A | * | 5/1999 | Sato et al. | ............. 315/111.51 |
| 5,997,687 A | * | 12/1999 | Koshimizu | ................... 156/345 |
| 6,177,763 B1 | * | 1/2001 | Morrow | ...................... 313/607 |
| 6,225,746 B1 | * | 5/2001 | Wickramanayaka | ... 315/111.51 |
| 6,291,937 B1 | * | 9/2001 | Okumura et al. | ....... 315/111.21 |
| 6,310,577 B1 | * | 10/2001 | Ra | ............................. 343/701 |
| 6,346,915 B1 | * | 2/2002 | Okumura et al. | ........... 343/701 |
| 6,387,288 B1 | * | 5/2002 | Bjorkman et al. | ............ 216/67 |
| 6,603,269 B1 | * | 8/2003 | Vo et al. | ................ 315/112.21 |
| 2002/0066535 A1 | * | 6/2002 | Brown et al. | .......... 156/345.29 |

FOREIGN PATENT DOCUMENTS

| | | |
|---|---|---|
| JP | 09/148097 | 6/1997 |
| JP | 09-275093 | 10/1997 |
| JP | 10-098028 | 4/1998 |
| JP | 2000-091244 | 3/2000 |
| JP | 2000-216136 | 8/2000 |

* cited by examiner

Primary Examiner—Tho Phan
(74) Attorney, Agent, or Firm—Wenderoth, Lind & Ponack L.L.P.

(57) ABSTRACT

A plasma processing method includes introducing a gas into a vacuum chamber through a hole of a dielectric tube attached to a metal body fixed to the vacuum chamber while exhausting from the vacuum chamber to keep the vacuum chamber within a specified pressure. High-frequency power with a frequency ranging from 100 kHz to 3 GHz is applied to a plasma source provided so as to face a substrate mounted on a substrate electrode in the vacuum chamber to generate plasma in the vacuum chamber to perform plasma processing of the substrate.

40 Claims, 7 Drawing Sheets

PLASMA PROCESSING METHOD AND APPARATUS THEREOF

BACKGROUND OF THE INVENTION

The present invention relates to a plasma processing method and an apparatus thereof for use in manufacturing electron devices and micro machines made of semiconductors.

In recent years, a thin film processing technique using plasma processing has become more and more important in the field of manufacturing semiconductor electron devices and micro machines.

As one example of prior art plasma processing methods, plasma processing with use of an inductively coupled plasma source will be described hereinbelow with reference to FIG. 8. In FIG. 8, a specified gas is introduced from a gas supply device 2 into a vacuum chamber 1 while being exhausted therefrom by a pump 3 serving as an exhauster to keep the vacuum chamber 1 within a specified pressure. Under such a condition, high-frequency power of 13.56 MHz can be supplied by a high-frequency power source 4 to a coil 23 to generate plasma in the vacuum chamber 1 to perform plasma processing of a substrate 7 mounted on a substrate electrode 6. In addition, there is provided a high-frequency power source for substrate electrode 8 for supplying high-frequency power to the substrate electrode 6, which enables control of ion energy reaching the substrate 7. It is noted that the coil 23 is disposed on top of a dielectric window 24. The gas is introduced into the vacuum chamber 1 through a plurality of gas supply holes 25 provided on a metal ring 16 which constitutes part of a side wall of the vacuum chamber 1.

However, in order to improve fine processability and enlarge the processing area, the flow of gas to be used in processing should be increased, and processing should be performed under lower pressure. This tends to induce abnormal electrical discharge called hollow cathode discharge in gas supply holes 25 in the prior art plasma processing.

A description of the hollow cathode discharge is as follows. In general, the surface of a solid in contact with plasma is negatively electrified due to a difference in thermal velocity between an electron and an ion, so that the solid surface obtains direct electric fields which send away electrons from the solid surface. In a space surrounded with the solid surface, like the inside of the gas supply hole 25 shown in the prior art, a tendency for electrons to collide with the solid surface is reduced due to the presence of the direct electric fields. This feature prolongs a lifetime of the electrons, resulting in generation of high-density plasmas (for example, at 100 MHz) inside the gas supply hole 25. The generated electric discharge is called hollow cathode discharge.

The hollow cathode discharge generated in the gas supply hole 25 causes deterioration of the gas supply hole (the lapse of time causes gradual increase of the diameter of the hole) 25 and contamination of a substrate by metal substances constituting the gas supply hole 25.

It is empirically indicated that a larger gas velocity in the gas supply hole 25 and a larger pressure gradient in the vicinity of the gas supply hole 25 tend to induce hollow cathode discharge. In addition, a larger gas flow rate and a lower pressure in the vacuum chamber 1 also tends to induce hollow cathode discharge. Accordingly, improvement of fine processability and implementation of a larger processing area require a larger flow rate of gas for use in processing and processing under lower pressure, which clarifies the importance of solving the issue of a hollow cathode discharge in the gas supply hole 25.

SUMMARY OF THE INVENTION

In view of the conventional issue stated above, an object of the present invention is to provide a plasma processing method and an apparatus thereof which decreases induction of hollow cathode discharge in the gas supply hole.

In accomplishing these and other aspects, according to a first aspect of the present invention, there is provided a plasma processing method comprising introducing a gas into a vacuum chamber through a hole of a dielectric tube attached to a metal body fixed to the vacuum chamber while exhausting from the vacuum chamber to keep the vacuum chamber within a specified pressure. High-frequency power with a frequency ranging from 100 kHz to 3 GHz is applied to a plasma source arranged so as to face a substrate mounted on a substrate electrode in the vacuum chamber to generate plasma in the vacuum chamber to perform plasma processing of the substrate.

According to an aspect of the present invention, there is provided a plasma processing method as defined in the first aspect, wherein high-frequency power with a frequency ranging from 100 kHz to 3 GHz is applied to an antenna serving as the plasma source with a dielectric plate interposed between the antenna and the vacuum chamber. The antenna and the dielectric plate protrude into the vacuum chamber.

According to a second aspect of the present invention, there is provided a plasma processing method as defined in the first aspect, wherein the high-frequency power is applied to an antenna serving as the plasma source through a penetrating hole given near a center of the dielectric plate. The antenna and the vacuum chamber are short-circuited with short pins through penetrating holes which are given at an area located not in a center nor a vicinity of the dielectric plate, and which are disposed at approximately equal intervals around a center of the antenna.

According to a third aspect of the present invention, there is provided a plasma processing method as defined in the first aspect, wherein a substrate is processed in a state in which a plasma distribution on the substrate is controlled by a circular and groove shaped plasma trap provided between the antenna and the vacuum chamber.

According to a fourth aspect of the present invention, there is provided a plasma processing method as defined in the first aspect, wherein a substrate is processed in a state in which a plasma distribution on the substrate is controlled by a groove-shaped plasma trap provided between the antenna and the metal body. The metal body is a ring arranged so as to form the plasma trap between the antenna and the ring.

According to a fifth aspect of the present invention, there is provided a plasma processing method comprising introducing a gas into a vacuum chamber through a hole of a dielectric tube attached to a facing electrode provided so as to face a substrate electrode in the vacuum chamber while exhausting from the vacuum chamber to keep the vacuum chamber within a specified pressure. High-frequency power with a frequency ranging from 100 kHz to 3 GHz is applied to the substrate electrode or the facing electrode to generate plasma in the vacuum chamber to perform plasma processing of the substrate.

According to a sixth aspect of the present invention, there is provided a plasma processing method as defined in the first aspect, wherein a gas supply flow rate per hole given to the dielectric tube is 200 sccm or less.

According to a seventh aspect of the present invention, there is provided a plasma processing method as defined in the first aspect, wherein a gas supply flow rate per hole given to the dielectric tube is 50 sccm or less.

According to an eighth aspect of the present invention, there is provided a plasma processing method as defined in the first aspect, wherein the gas is a mixed gas mainly composed of an argon gas.

According to a ninth aspect of the present invention, there is provided a plasma processing method as defined in the first aspect, wherein pressure in the vacuum chamber is 10 Pa or less.

According to a 10th aspect of the present invention, there is provided a plasma processing method as defined in the first aspect, wherein pressure in the vacuum chamber is 1 Pa or less.

According to an 11th aspect of the present invention, there is provided a plasma processing method as defined in the first aspect, wherein a frequency of the high-frequency power applied to the plasma source, the substrate electrode or the facing electrode is 50 MHz to 3 GHz.

According to a 12th aspect of the present invention, there is provided a plasma processing method as defined in the sixth aspect, wherein a gas supply flow rate per hole given to the dielectric tube is 200 sccm or less.

According to a 13th aspect of the present invention, there is provided a plasma processing method as defined in the sixth aspect, wherein a gas supply flow rate per hole given to the dielectric tube is 50 sccm or less.

According to a 14th aspect of the present invention, there is provided a plasma processing method as defined in the sixth aspect, wherein the gas is a mixed gas mainly composed of an argon gas.

According to a 15th aspect of the present invention, there is provided a plasma processing method as defined in the sixth aspect, wherein pressure in the vacuum chamber is 10 Pa or less.

According to a 16th aspect of the present invention, there is provided a plasma processing method as defined in the sixth aspect, wherein pressure in the vacuum chamber is 1 Pa or less.

According to a 17th aspect of the present invention, there is provided a plasma processing method as defined in the sixth aspect, wherein a frequency of the high-frequency power applied to the plasma source, the substrate electrode or the facing electrode is 50 MHz to 3 GHz.

According to an 18th aspect of the present invention, there is provided a plasma processing apparatus comprising a vacuum chamber capable of maintaining a vacuum state; a gas supply device for supplying a gas into the vacuum chamber; an exhauster for exhausting the gas from the vacuum chamber; a substrate electrode for mounting a substrate in the vacuum chamber; a plasma source provided so as to face the substrate electrode; a high-frequency power source for supplying high-frequency power with a frequency ranging from 100 kHz to 3 GHz to the plasma source; and a dielectric tube having a gas supply hole, and being attached to a metal body fixed to the vacuum chamber. Gas is passed through the gas supply hole of the dielectric tube when the gas is supplied to the vacuum chamber by the gas supply device.

According to a 19th aspect of the present invention, there is provided a plasma processing apparatus as defined in the 18th aspect, wherein a dielectric plate is interposed between the vacuum chamber and an antenna serving as the plasma source. The antenna and the dielectric plate protrude into the vacuum chamber.

According to a 20th aspect of the present invention, there is provided a plasma processing apparatus as defined in the 19th aspect, wherein high-frequency power is supplied to the antenna through a penetrating hole given near a center of the dielectric plate. The antenna and the vacuum chamber are short-circuited with short pins through penetrating holes which are given at an area located not in a center nor a vicinity of the dielectric plate and which are disposed at approximately equal intervals around a center of the antenna.

According to a 21st aspect of the present invention, there is provided a plasma processing apparatus as defined in the 19th aspect, wherein a substrate is processed in a state in which a plasma distribution on the substrate is controlled by a circular and groove-shaped plasma trap provided between the antenna and the vacuum chamber.

According to a 22nd aspect of the present invention, there is provided a plasma processing apparatus as defined in the 18th aspect, wherein the metal body is a ring that constitutes a part of a side wall of the vacuum chamber.

According to a 23rd aspect of the present invention, there is provided a plasma processing apparatus as defined in the 21st aspect, wherein the metal body is a ring disposed so as to constitute a plasma trap between the metal body and the antenna.

According to a 24th aspect of the present invention, there is provided a plasma processing apparatus comprising: a vacuum chamber capable of maintaining a vacuum state; a gas supply device for supplying a gas into the vacuum chamber; an exhauster for exhausting the gas from the vacuum chamber; a substrate electrode for mounting a substrate in the vacuum chamber; a facing electrode provided so as to face the substrate electrode; a high-frequency power source for supplying high-frequency power with a frequency ranging from 100 kHz to 3 GHz to the substrate electrode or the facing electrode; and a dielectric tube having a gas supply hole, and being attached to a metal body fixed to the facing electrode. The gas passes through the gas supply hole of the dielectric tube when the gas is supplied to the vacuum chamber by the gas supply device.

According to a 25th aspect of the present invention, there is provided a plasma processing apparatus as defined in the 18th aspect, wherein the dielectric tube is a bolt screwed in a tap given to the metal body or the facing electrode.

According to a 26th aspect of the present invention, there is provided a plasma processing apparatus as defined in the 18th aspect, wherein the dielectric tube has a spot facing for a screwdriver or a wrench on a side of an inner wall of the vacuum chamber for rotating and screwing the dielectric tube in the metal plate or the facing electrode.

According to a 27th aspect of the present invention, there is provided a plasma processing apparatus as defined in the 18th aspect, wherein the dielectric tube protrudes 0.5 to 20 mm from a surface of the metal body or the facing electrode.

According to a 28th aspect of the present invention, there is provided a plasma processing apparatus as defined in the 18th aspect, wherein the dielectric tube protrudes 1 to 10 mm from a surface of the metal body or the facing electrode.

According to a 29th aspect of the present invention, there is provided a plasma processing apparatus as defined in the 27th or 28th aspect, wherein the dielectric tube is disposed such that it covers an edge of a hole of the metal body or the facing electrode.

According to a 30th aspect of the present invention, there is provided a plasma processing apparatus as defined in the 18th aspect, wherein the hole of the dielectric tube is 0.2 to 2 mm in diameter.

According to a 31st aspect of the present invention, there is provided a plasma processing apparatus as defined in the 18th aspect, wherein the hole of the dielectric tube is 0.4 to 0.8 mm in diameter.

According to a 32nd aspect of the present invention, there is provided a plasma processing apparatus as defined in the 18th aspect, wherein a frequency of high-frequency power applied to the plasma source, the substrate electrode or the facing electrode is 50 MHz to 3 GHz.

According to a 33rd aspect of the present invention, there is provided a plasma processing apparatus as defined in the 24th aspect, wherein the dielectric tube is a bolt screwed in a tap provided in the metal body or the facing electrode.

According to a 34th aspect of the present invention, there is provided a plasma processing apparatus as defined in the 24th aspect, wherein the dielectric tube has a spot facing for a screwdriver or a wrench on a side of an inner wall of the vacuum chamber for rotating and screwing the dielectric tube in the metal plate or the facing electrode.

According to a 35th aspect of the present invention, there is provided a plasma processing apparatus as defined in the 24th aspect, wherein the dielectric tube protrudes 0.5 to 20 mm from a surface of the metal body or the facing electrode.

According to a 36th aspect of the present invention, there is provided a plasma processing apparatus as defined in the 24th aspect, wherein the dielectric tube protrudes 1 to 10 mm from a surface of the metal body or the facing electrode.

According to a 37th aspect of the present invention, there is provided a plasma processing apparatus as defined in the 27th or 28th aspect, wherein the dielectric tube is disposed such that it covers an edge of a hole of the metal body or the facing electrode.

According to a 38th aspect of the present invention, there is provided a plasma processing apparatus as defined in the 24th aspect, wherein the hole of the dielectric tube is 0.2 to 2 mm in diameter.

According to a 39th aspect of the present invention, there is provided a plasma processing apparatus as defined in the 24th aspect, wherein the hole of the dielectric tube is 0.4 to 0.8 mm in diameter.

According to a 40th aspect of the present invention, there is provided a plasma processing apparatus as defined in the 24th aspect, wherein a frequency of high-frequency power applied to the plasma source, the substrate electrode or the facing electrode is 50 MHz to 3 GHz.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
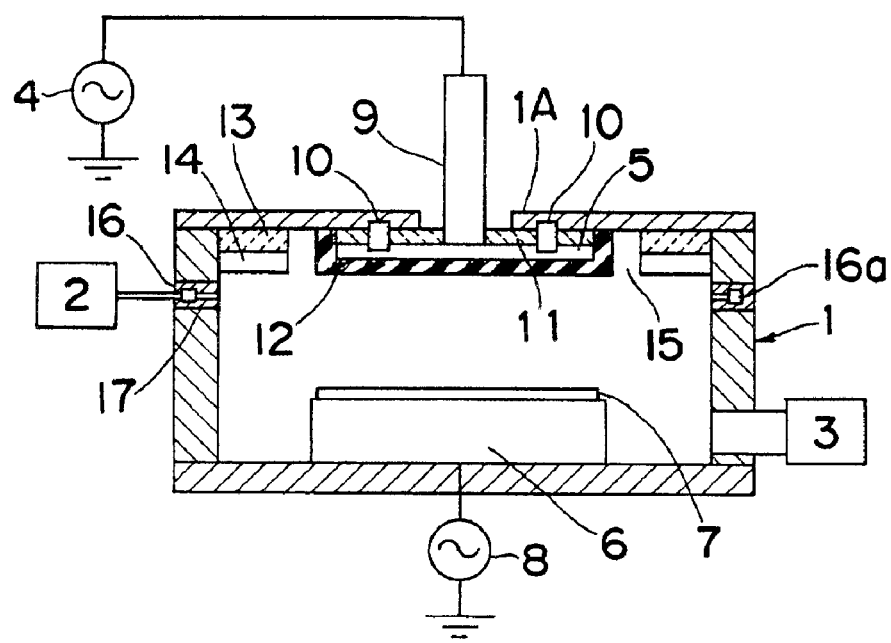
FIG. 1 is a cross sectional view showing the arrangement of a plasma processing apparatus for use in a first embodiment of the present invention.

Before the description of the present invention proceeds, it is to be noted that like parts are designated by like reference numerals throughout the accompanying drawings.

Description will now be given of the first embodiment of the present invention with reference to FIGS. 1 to 3.

FIG. 1 shows a cross sectional view of a plasma processing apparatus for use in the first embodiment of the present invention. In FIG. 1, a specified gas is introduced from a gas supply device 2 into a vacuum chamber 1 while being exhausted therefrom by a pump 3 serving as an example of an exhauster to keep the vacuum chamber 1 within a specified pressure. Under such a condition, high-frequency power of 100 MHz can be supplied by a high-frequency power source 4 to an antenna 5, as one example of a plasma source, protruding into the vacuum chamber 1 to generate plasma in the vacuum chamber 1 to perform plasma processing of a substrate 7 mounted on a substrate electrode 6. In addition, there is provided a high-frequency power source 8 for supplying high-frequency power to the substrate electrode 6, which enables control of ion energy reaching the substrate 7. High-frequency voltage supplied to the antenna 5 is guided by a feed bar 9 to a central part of the antenna 5. A plurality of areas located not in the center nor the vicinity of the antenna 5 and a plane (upper chamber wall) 1A of the vacuum chamber 1 facing the substrate 7 are short-circuited by short pins 10. A dielectric plate 11 is interposed between the antenna 5 and the vacuum chamber 1. Through penetrating holes provided on the dielectric plate 11, the feed bar 9 and the short pins 10 connect the antenna 5 to the high-frequency power source 4 and connect the antenna 5 to a vacuum chamber 1, respectively. The surface of the antenna 5 is covered with an insulative cover 12. A plasma trap 15 made up of a groove-shaped space is arranged between the dielectric plate 11 and a dielectric ring 13 in the vicinity of the dielectric plate 11, and made of a groove-shaped space between the antenna 5 and a conduction ring 14 in the vicinity of the antenna 5. By the gas supply device 2, the gas is introduced into the vacuum chamber 1 through a gas supply hole 18 (See FIG. 2) provided in a dielectric bushing 17, which is one example of a dielectric tube. The bushing 17 is attached to a metal ring 16 which constitutes a part of a side wall of the vacuum chamber 1, and the metal ring 16 has a ring-shaped gas passage 16a therein and is made of metal such as aluminum or stainless steel.

Figure 2:
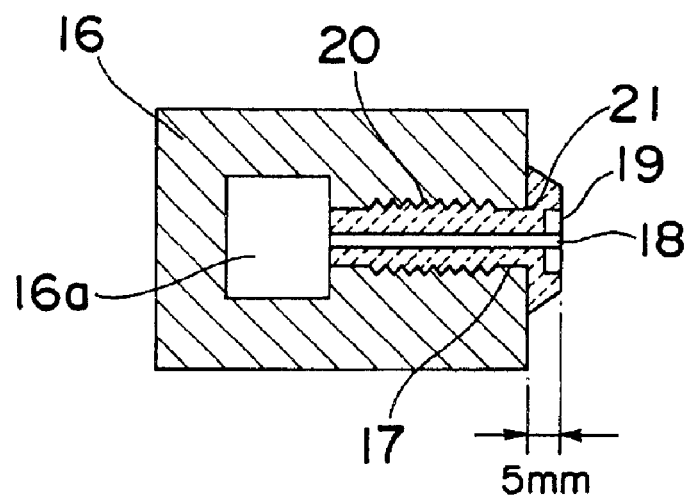
FIG. 2 is a detail view showing the vicinity of a dielectric bushing for use in the first embodiment of the present invention.
Figure 9:
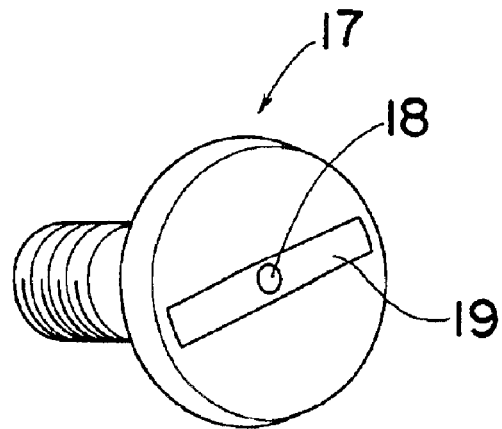
FIG. 9 is a perspective view of the dielectric bushing according to the first embodiment.

FIG. 2 shows a detail view around the dielectric bushing 17 made of ceramic as one example. On the side of the inner wall of the vacuum chamber 1, there is provided a spot facing for a screw driver 19 (See FIG. 9) for rotating and screwing the dielectric bushing 17 into the metal ring 16. The metal ring 16 is equipped with a tap 20 for screwing in the dielectric bushing 17. The dielectric bushing 17 has the shape of a bolt, and protrudes by 5 mm from the surface of the metal ring 16. The dielectric bushing 17 is disposed such that it covers an edge 21 of a hole provided on the metal ring 16. The gas supply hole 18 in the dielectric bushing 17 is 0.5 mm in diameter. The metal ring 16 is equipped with a total of eight dielectric bushes 17, making it possible to blow out gas into the vacuum chamber 1 in an approximately isotropic direction. FIG. 3 shows a plan view of the antenna 5. In FIG. 3, the short pins 10 are put in three locations. Each of three short pins 10 is disposed at equal intervals around the center of the antenna 5.

Figure 3:
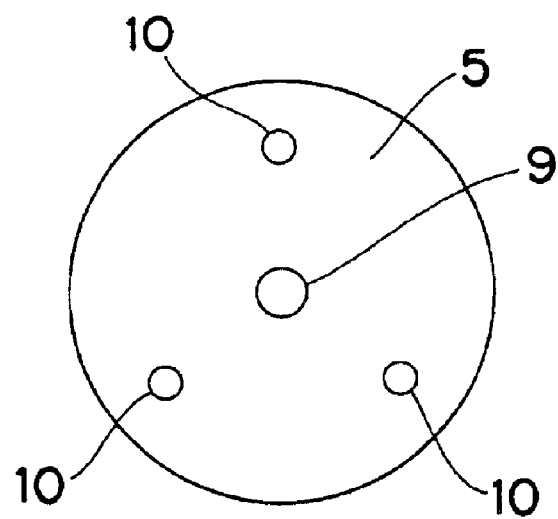
FIG. 3 is a plan view showing an antenna for use in the first embodiment of the present invention.

With the plasma processing apparatus shown in FIGS. 1 to 3, a substrate having an iridium film was etched. Etching was conducted under the conditions of argon gas of 260 sccm and chlorine gas of 20 sccm, a pressure of 0.3 Pa, antenna power of 1500W, and substrate electrode power of 400W. Total gas flow rate was 260+20=280 sccm, and the number of gas supply holes was eight, so that the gas supply flow rate per gas supply hole was 280/8=35 sccm. As a result of etching under such conditions, hollow cathode discharge in each gas supply hole 18 did not occur, and therefore a good discharge condition was obtained.

The reason why the hollow cathode discharge could be suppressed may be that high-frequency electric fields in each gas supply hole 18 were weakened compared to those in the prior art example. It can be considered that an inclination for occurrence of the hollow cathode discharge is largely influenced by high-frequency electric fields reaching the gas supply holes as well as a gas velocity or pressure gradient. It can be understood that forming the vicinity of each gas supply hole 18 of a dielectric substance (the dielectric bushing) and protruding the dielectric bushing 17 by 5 mm from the surface of the metal ring 16 will weaken high-frequency electric fields in an outlet of each gas supply hole 18, thereby enabling suppression of the hollow cathode discharge.

The above-described first embodiment of the present invention is just one example of a number of variations available in the shape of the vacuum chamber as well as the shape and disposition of the antenna within an applicable range of the present invention. It will be understood that diverse variations other than the one exemplified above are available in applying the present invention.

In the above described first embodiment of the present invention, high-frequency voltage is supplied to the antenna through a penetrating hole given near the center of the dielectric plate, and the antenna and the vacuum chamber are short-circuited with the short pins through penetrating holes which are located not in the center nor in the vicinity of the dielectric plate and which are disposed at approximately equal intervals around the center of the antenna. Such construction makes it possible to increase isotropy of plasma. In the case of handling a small substrate, the present invention ensures sufficiently high inplane uniformity without the use of the short pins.

Further, in the first embodiment of the present invention, there has been described the case of processing the substrate in a state in which the plasma distribution on the substrate was controlled by the circular and groove-shaped plasma trap provided between the antenna and the vacuum chamber. Such construction contributes to increased uniformity of the plasma. In the case of handling a small substrate, the present invention ensures sufficiently high inplane uniformity without using the plasma trap.

Figure 4:
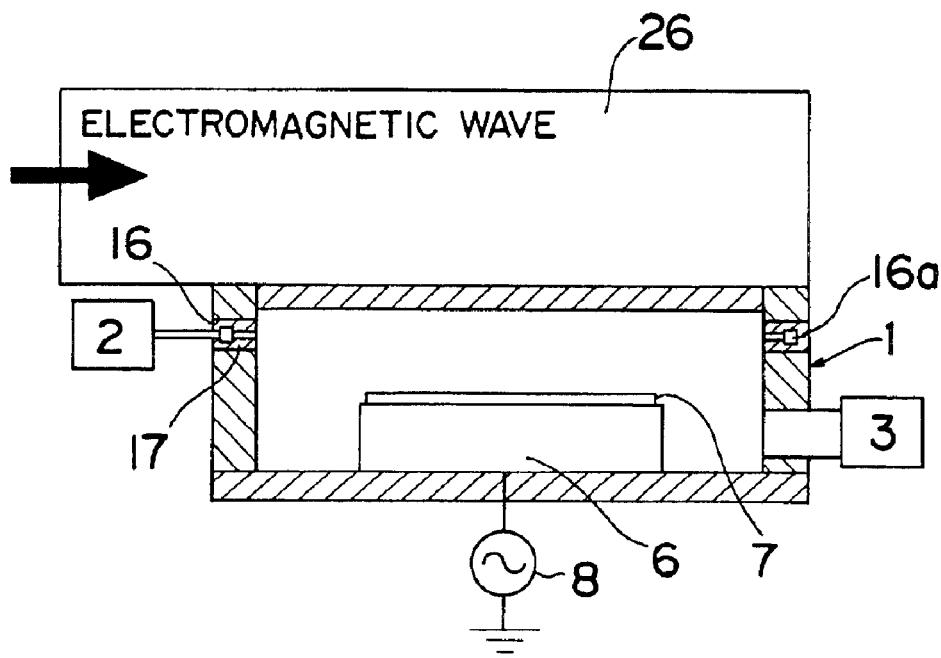
FIG. 4 is a cross sectional view showing an arrangement in which the present invention is applied to a plasma processing apparatus with a surface wave plasma source.
Figure 8:
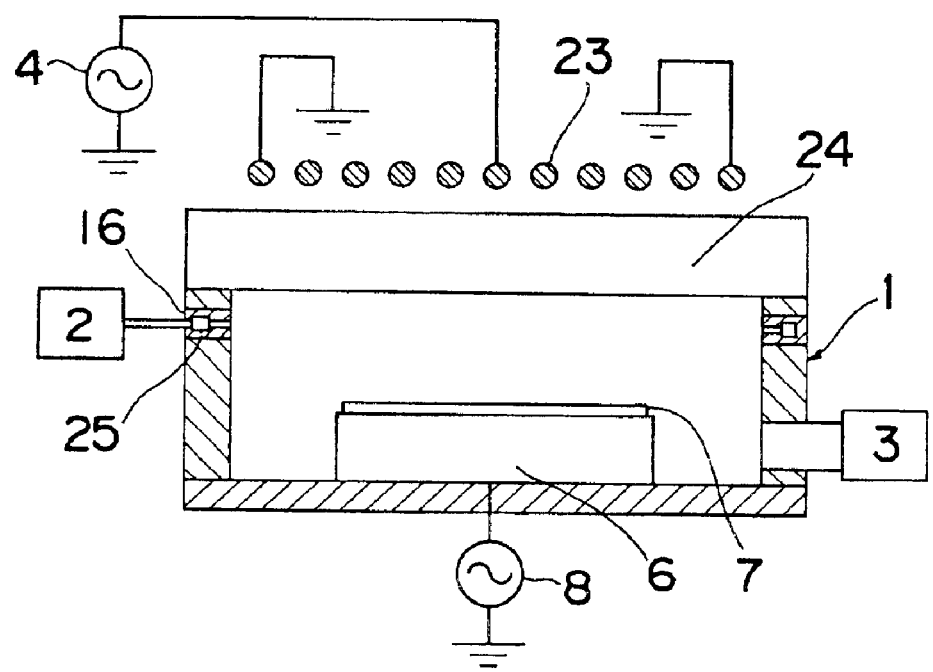
FIG. 8 is a cross sectional view showing an arrangement of a plasma processing apparatus for use in the prior art.

The present invention is also effective when using the coil 23 as the antenna, as in the case with the inductively coupled plasma source shown in FIG. 8 showing a prior art example. Alternatively, the present invention is effective when using an electromagnetic radiation antenna 26, as in the case with a surface wave plasma source shown in FIG. 4.

Figure 5:
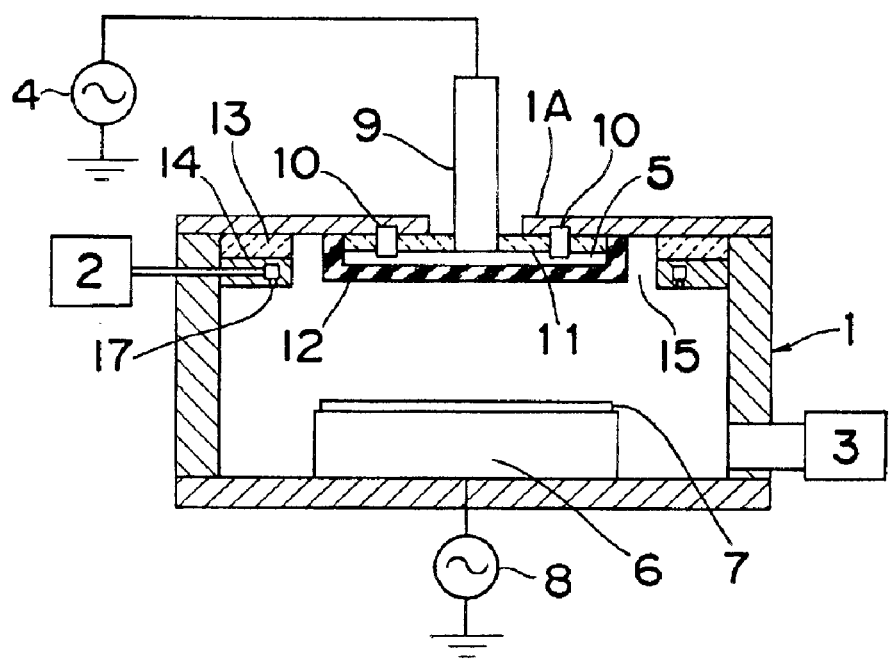
FIG. 5 is a cross sectional view showing an arrangement of the plasma processing apparatus in a modified example of the first embodiment of the present invention.

In the first embodiment of the present invention shown above, the metal body with the dielectric bushing embedded therein is the ring that constitutes a part of the side wall of the vacuum chamber. Such construction is also effective when, as shown in FIG. 5, the metal body with a dielectric bushing embedded therein is a conduction ring 14 arranged so as to form a plasma trap is between the metal body and the antenna.

Description will now be given of a second embodiment of the present invention with reference to FIGS. 6 to 7.

Figure 6:
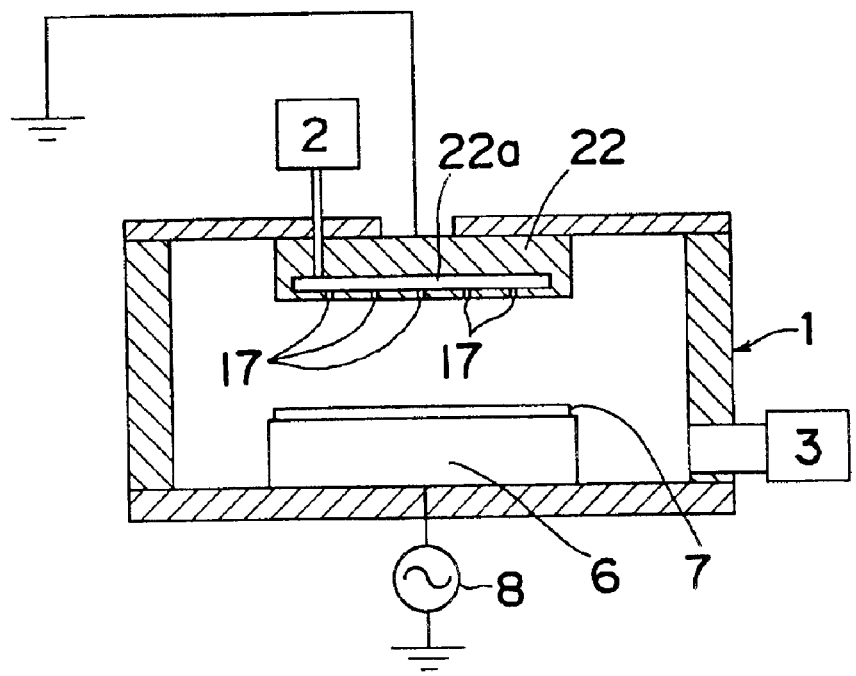
FIG. 6 is a cross sectional view showing an arrangement of a plasma processing apparatus for use in a second embodiment of the present invention.

FIG. 6 is a cross sectional view of a plasma processing apparatus for use in the second embodiment of the present invention. In FIG. 6, a specified gas is introduced from a gas supply device 2 into a vacuum chamber 1 while being exhausted therefrom by a pump 3 serving as an example of an exhauster to keep the vacuum chamber 1 within a specified pressure. Under such a condition, high-frequency power of 13.56 MHz can be supplied by a high-frequency power source 8 to a substrate electrode 6 to generate plasma in the vacuum chamber 1 to perform plasma processing of a substrate 7 mounted on a substrate electrode 6. There is provided a facing electrode 22 that faces the substrate electrode 6 and has therein a gas passage 22a connected to a plurality of holes with taps 20. The gas is introduced into the vacuum chamber 1 through a gas supply hole 18 (See FIG. 7) in each dielectric bushing 17, which is one example of a dielectric tube, placed on the facing electrode 22.

Figure 7:
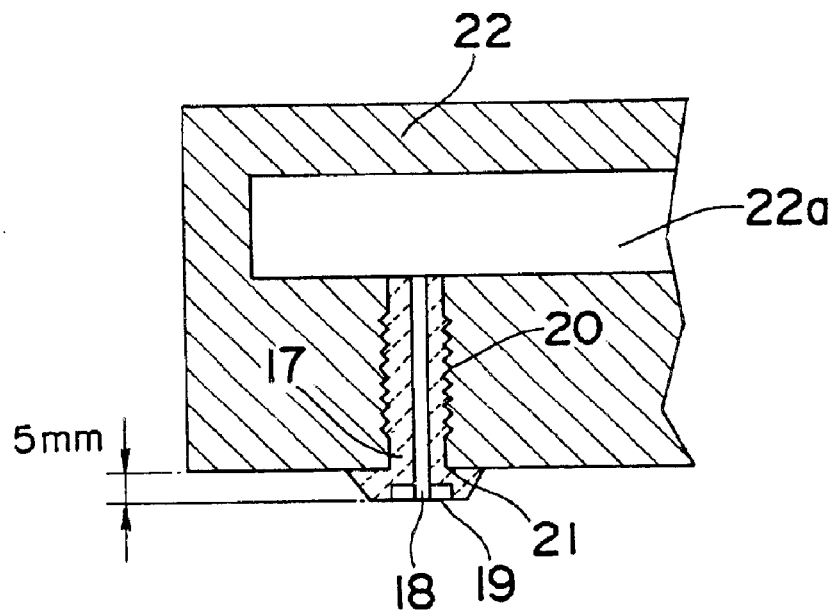
FIG. 7 is a detail view showing the vicinity of a dielectric bushing for use in the second embodiment of the present invention.

FIG. 7 shows a detail view around the dielectric bushing 17 made of ceramic, for example. On the side of the inner wall of the vacuum chamber 1, the dielectric bushing 17 has a spot facing for a screw driver 19 (See FIG. 9) for rotating and screwing the dielectric bushing 17 in the facing electrode 22. The facing electrode 22 is equipped with a tap 20 for screwing in the dielectric bushing 17. The dielectric bushing 17 has the shape of a bolt, and protrudes by 5 mm from the surface of the facing electrode 22. The dielectric bushing 17 is arranged so that it covers an edge 21 of a hole provided on the facing electrode 22. A gas supply hole 18 in the dielectric bushing 17 is 0.5 mm in diameter. The facing electrode 22 is equipped with a total of 80 dielectric bushing 17, making it possible to blow out gas toward a substrate in the vacuum chamber 1.

With the plasma processing apparatus shown in FIGS. 6 to 7, a substrate having an aluminum film was etched. Etching was conducted under the conditions of chlorine gas of 200 sccm, boron trichloride gas of 600 sccm, argon gas of 800 sccm, a pressure of 5 Pa, and substrate electrode power of 4 kW. Total gas flow rate was 200+600+800=1600 sccm, and the number of gas supply holes was 80, so that gas supply flow rate per gas supply hole was 1600/80=20 sccm. As a result of etching under such conditions, a hollow cathode discharge in each gas supply hole 18 did not occur, and therefore good discharge condition was obtained.

The reason why the hollow cathode discharge could be suppressed may be that high-frequency electric fields in each gas supply hole 18 were weakened compared to those in the prior art example. An inclination for occurrence of the hollow cathode discharge is largely influenced by high-frequency electric fields reaching the gas supply holes, as well as the gas velocity or pressure gradient. It can be understood that forming the vicinity of each gas supply hole 18 of a dielectric substance (for as a dielectric bushing) and protruding the dielectric bushing 17 by 5 mm from the surface of the facing electrode 22 will weaken high-frequency electric fields in an outlet of each gas supply hole 18, thereby enabling suppression of the hollow cathode discharge.

In the above described embodiments of the present invention, the dielectric bushing is a bolt screwed in the tap in the metal body or the facing electrode. However, the dielectric bushing is not necessarily in the shape of a bolt, but may be embedded into the metal body or the facing electrode in the shape of a wedge. The dielectric bushing in the shape of a bolt has an advantage that replacement thereof as an expendable component is easy.

Further, it has been described that the dielectric bushing has a spot facing for a screw driver on the side of the inner wall of the vacuum chamber for rotating and screwing the dielectric bushing in the metal plate or the facing electrode. However, other than the spot facing for the screw driver, the present invention may adopt shapes for various tools such as wrenches. It goes without saying that the spot facing is not necessary if the dielectric bushing is wedge-shaped.

As described above, the dielectric bushing protrudes by 5 mm from the surface of the metal body or the facing electrode. Since an experimental result proves that approximately 0.5 mm or more protrusion is desirable, the length of protrusion of the dielectric bushing is preferably within this range. However, excessive protrusion may lead to breakage of the dielectric bushing, and therefore the dielectric bushing may preferably protrude by approximately 20 mm or less. Accordingly, an optimum length of protrusion of the dielectric bushing is about 1 to 10 mm, which ensures suppression of hollow cathode discharge and prevents breakage of the dielectric bushing.

As described above, the dielectric bushing is arranged so that it covers the edge of the hole provided in the metal body or the facing electrode. Such construction is preferable since it can effectively prevent the edge of the hole provided in the metal body or the facing electrode from deteriorating due to exposure to plasma for a long period of time.

As described above, the hole in the dielectric bushing is 0.5 mm in diameter. Since an experimental result proves that a smaller hole reduces a tendency for occurrence of hollow cathode discharge, the size of the hole is preferably about 2 mm or less. However too small a hole increases difficulty in processability, and therefore the diameter of the hole is preferably 0.2 mm or more. Accordingly, an optimum diameter of the hole is considered to be about 0.4 to 0.8 mm, which ensures suppression of hollow cathode discharge and facilitates processing.

Cases in which the gas supply flow rate per hole for the dielectric bushing was 35 sccm and 20 sccm have been described. Since an experimental result proves that a smaller gas supply flow rate per hole reduces a tendency for occurrence of hollow cathode discharge, gas supply flow rate per hole is preferably around 200 sccm or less. For more secure suppression of hollow cathode discharge, gas supply flow rate per hole for the dielectric bushing is preferably 50 sccm or less. To meet such conditions, an increase in the number of gas supply holes is effective, as well as a decrease in the gas flow rate in plasma processing.

As described above, a gas for use in the present invention is a mixed gas mainly composed of an argon gas. It has been empirically proven that a tendency for occurrence of hollow cathode discharge differs by types of gases, and an argon gas considerably increases the tendency. Accordingly, the present invention is particularly effective when a mixed gas mainly composed of an argon gas is in use. In the case of using other gases, the present invention is also quite effective for suppression of hollow cathode discharge.

Cases in which the pressure in the vacuum chamber was 0.3 Pa and 5 Pa have also been described. Since lower pressure in the vacuum chamber increases a tendency for occurrence of hollow cathode discharge, the present invention is effective when the pressure in the vacuum chamber is 10 Pa or less. The present invention is further effective when the pressure in the vacuum chamber is 1 Pa or less.

Cases in which a frequency of high-frequency power applied to the antenna, the substrate electrode, or the facing electrode was 100 MHz or 13.56 MHz have also been described. In plasma processing with low pressure, there can be used high-frequency power ranging from 100 kHz to 3 GHz, and over such a broad range, the present invention is effective. However, with a higher frequency of high-frequency power, electromagnetic waves tend to spread in a wider range, which tends to increase high-frequency electric fields in the gas supply hole. Accordingly, the present invention is effective when the frequency of high frequency power is high, especially in the range from 50 MHz to 3 GHz.

Figure 10:
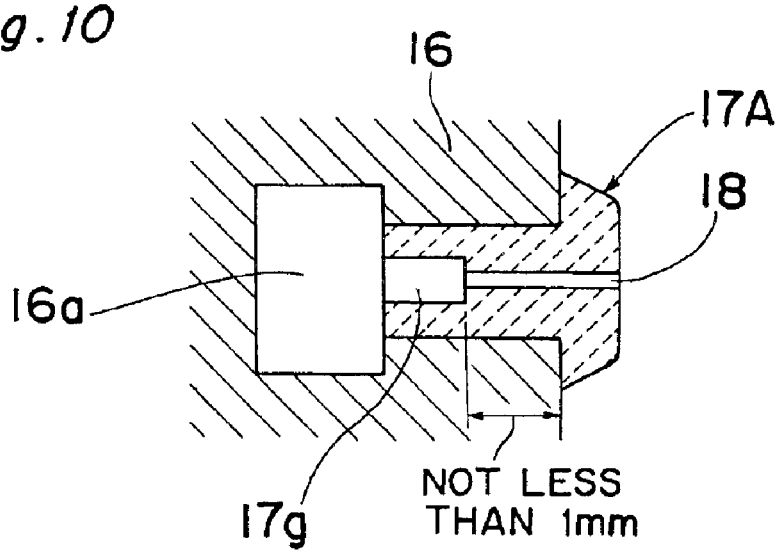
FIG. 10 is a sectional view of a dielectric bushing according to a first modification of the first embodiment.

FIG. 10 is a sectional view of a dielectric bushing 17A according to a first modification of the first embodiment. The dielectric bushing 17A has a spot facing 17g at the inner end side thereof with the diameter of the spot facing being larger than the diameter of the gas supply hole 18, and with the spot facing 17g being connected to the gas passage 16a. The length of the gas supply hole 18 is not less than 1 mm, preferably, so as to surely obtain the above effects.

Figure 11:
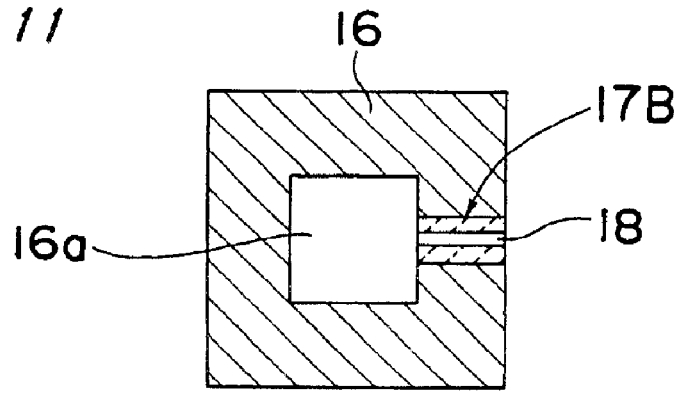
FIG. 11 is a sectional view of a dielectric bushing according to a second modification of the first embodiment.

FIG. 11 is a sectional view of a dielectric bushing 17B according to a second modification of the first embodiment, in which the dielectric bushing 17B does not protrude from the surface of the metal ring 16 in a case where Ar gas and the antenna power of 500W or less are used.

Figure 12:
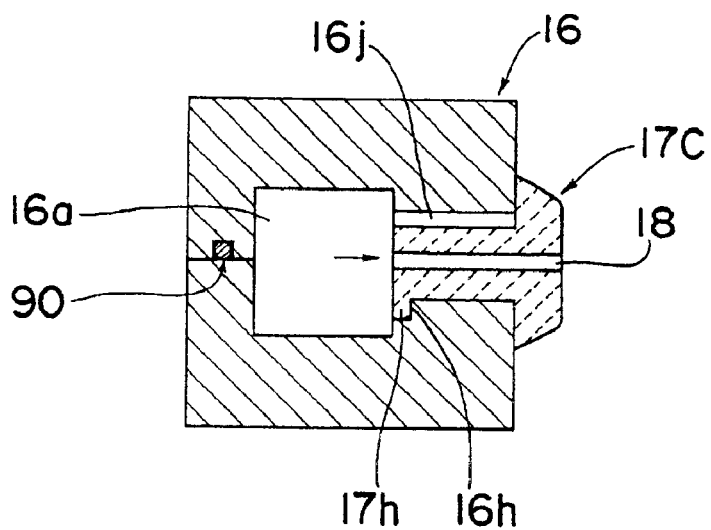
FIG. 12 is a sectional view of a dielectric bushing according to a third modification of the first embodiment.
Figure 13:
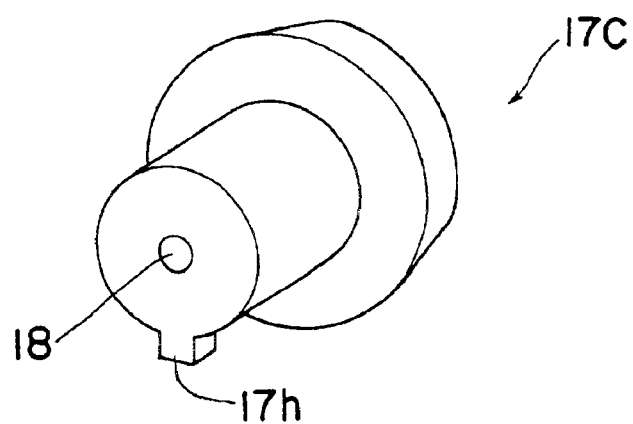
FIG. 13 is a perspective view of the dielectric bushing according to the third modification of the first embodiment.

FIGS. 12 and 13 are a sectional view and a perspective view of a dielectric bushing 17C according to a third modification of the first embodiment, in which the dielectric bushing 17C has a lateral projection 17h, instead of a screw portion, for engaging a recess 16h. The projection 17h can pass through a groove 16j of the metal ring 16, and then the dielectric bushing 17C is rotated to engage the projection 17h with the recess 16h. Therefore, the dielectric bushing 17C is not removed from the metal ring 16 in its axial direction. When the dielectric bushing 17C is removed from the metal ring 16, the dielectric bushing 17C is rotated to align the projection 17h with the groove 16j, so that the dielectric bushing 17C is removed from the metal ring 16 along its axial direction.

Figure 14:
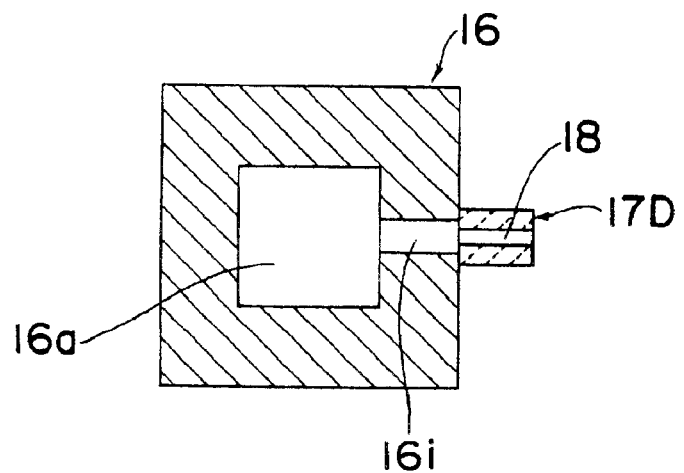
FIG. 14 is a sectional view of a dielectric bushing according to a fourth modification of the first embodiment.

FIG. 14 is a sectional view of a dielectric bushing 17D according to a fourth modification of the first embodiment, in which the entire dielectric bushing 17D protrudes from the surface of the metal ring 16 with the gas supply hole 18 connected to a gas hole 16i of the metal ring 16.

As is clear from the above description, according to the plasma processing method in the present invention, the gas is introduced into the vacuum chamber while being exhausted therefrom to keep the vacuum chamber within a specified pressure. Under such a condition, high-frequency power with a frequency ranging from 100 kHz to 3 GHz is applied to the plasma source, such as the antenna, so as to face the substrate mounted on the substrate electrode in the vacuum chamber to generate plasma in the vacuum chamber to perform plasma processing of the substrate. In this method, the gas is supplied to the vacuum chamber through the hole in the dielectric bushing embedded in the metal body, which implements plasma processing for reducing the occurrence of hollow cathode discharge in the gas supply hole.

According to the plasma processing method in the present invention, the gas is introduced into the vacuum chamber while being exhausted therefrom to keep the vacuum chamber within a specified pressure. Under such a condition, high-frequency power with a frequency ranging from 100 kHz to 3 GHz is applied to the substrate electrode or the facing electrode provided so as to face the substrate electrode in the vacuum chamber to generate plasma in the vacuum chamber to perform plasma processing of a substrate mounted on the substrate electrode. In this method, the gas is supplied to the vacuum chamber through the hole in the dielectric bushing embedded in the facing electrode, which implements plasma processing that reduces a tendency for occurrence of hollow cathode discharge in the gas supply hole.

According to the plasma processing apparatus in the present invention, the plasma processing apparatus is made up of the vacuum chamber, the gas supply device for supplying the gas into the vacuum chamber, the exhauster for exhausting the gas from the vacuum chamber, the substrate electrode for mounting the substrate in the vacuum chamber, the plasma source (such as the antenna) arranged so as to face the substrate electrode, and the high-frequency power source for supplying high-frequency power with a frequency ranging from 100 kHz to 3 GHz to the antenna. In this device, the gas is supplied to the vacuum chamber through the hole in the dielectric bushing embedded in the metal body, which implements plasma processing that reduces a tendency for occurrence of hollow cathode discharge in the gas supply hole.

According to the plasma processing apparatus in the present invention, the plasma processing apparatus is made up of the vacuum chamber, the gas supply device for supplying the gas into the vacuum chamber, the exhauster for exhausting the gas from the vacuum chamber, the substrate electrode for mounting the substrate in the vacuum chamber, the facing electrode arranged so as to face the substrate electrode, and the high-frequency power source for supplying high-frequency frequency power with a frequency ranging from 100 kHz to 3 GHz to the substrate electrode or the facing electrode. In this device, the gas is supplied to the vacuum chamber through the hole in the dielectric bushing embedded in the facing electrode, which implements plasma processing that reduces a tendency for occurrence of hollow cathode discharge in the gas supply hole.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method comprising:

introducing a gas into an interior of a vacuum chamber through a hole in a dielectric tube attached to a metal body fixed to the vacuum chamber, while exhausting gas from the vacuum chamber to keep the vacuum chamber within a specified pressure; and applying high-frequency power with a frequency ranging from 100 kHz to 3 GHz to a plasma source facing a substrate mounted on a substrate electrode in the vacuum chamber, to generate plasma in the vacuum chamber to perform plasma processing of the substrate, the plasma source being spaced apart from the dielectric tube.

2. The plasma processing method of claim 1, wherein the plasma source comprises an antenna, a dielectric plate is arranged between the antenna and the vacuum chamber, and the high-frequency power is applied to the antenna through a penetrating hole at a center of the dielectric plate, the antenna and the vacuum chamber being short-circuited with short pins extending through penetrating holes arranged in the dielectric plate so that the short pins are arranged at approximately equal intervals around a center of the antenna.

3. The plasma processing method of claim 1, wherein the plasma source comprises an antenna, further comprising controlling a plasma distribution on the substrate using a circular and groove-shaped plasma trap arranged between the antenna and the vacuum chamber.

4. The plasma processing method of claim 1, wherein the plasma source comprises an antenna, and the metal body comprises a ring arranged to form a groove-shaped plasma trap between the antenna and the ring, further comprising controlling a plasma distribution on the substrate using the plasma trap.

5. The plasma processing method of claim 1, wherein said introducing of the gas into the interior of the vacuum chamber comprises introducing the gas such that a gas supply flow rate per hole in the dielectric tube is no greater than 50 sccm.

6. The plasma processing method of claim 1, wherein said introducing of the gas into the interior of the vacuum chamber comprises introducing a mixed gas including more than 50% argon gas.

7. The plasma processing method of claim 1, wherein said exhausting gas from the vacuum chamber to keep the vacuum chamber within a specified pressure comprises maintaining a pressure no greater than 10 Pa in the vacuum chamber.

8. The plasma processing method of claim 1, wherein said exhausting gas from the vacuum chamber to keep the vacuum chamber within a specified pressure comprises maintaining a pressure no greater than 1 Pa in the vacuum chamber.

9. The plasma processing method of claim 1, wherein said applying of the high-frequency power comprises applying a high-frequency power having a frequency of 50 MHz to 3 GHz to one of the plasma source, the substrate electrode, and a facing electrode.

10. The plasma processing method of claim 1, wherein said introducing of the gas into the interior of the vacuum chamber comprises introducing the gas such that a gas supply flow rate per hole in the dielectric tube is no greater than 200 sccm.

11. The plasma processing method of claim 10, wherein said introducing of the gas into the interior of the vacuum chamber comprises introducing the gas such that a gas supply flow rate per hole in the dielectric tube is no greater than 50 sccm.

12. The plasma processing method of claim 10, wherein said introducing of the gas into the interior of the vacuum chamber comprises introducing a mixed gas including more than 50% argon gas.

13. The plasma processing method of claim 10, wherein said exhausting gas from the vacuum chamber to keep the vacuum chamber within a specified pressure comprises maintaining a pressure no greater than 10 Pa in the vacuum chamber.

14. The plasma processing method of claim 10, wherein said exhausting gas from the vacuum chamber to keep the vacuum chamber within a specified pressure comprises maintaining a pressure no greater than 1 Pa in the vacuum chamber.

15. The plasma processing method of claim 10, wherein said applying of the high-frequency power comprises applying a high-frequency power having a frequency of 50 MHz to 3 GHz to one of the plasma source, the substrate electrode, and a facing electrode.

16. The plasma processing method of claim 1, wherein the dielectric tube through which the gas is introduced protrudes by an amount in a range of 0.5 mm to 20 mm from a surface of one of the metal body and a facing electrode.

17. A plasma processing method comprising:
introducing a gas into an interior of a vacuum chamber through a hole in a dielectric tube attached to a facing electrode facing a substrate electrode in the vacuum chamber, while exhausting gas from the vacuum chamber to keep the vacuum chamber within a specified pressure, the dielectric tube through which the gas is introduced protruding by an amount in a range of 0.5 mm to 20 mm from a surface of the facing electrode; and
applying high-frequency power with a frequency ranging from 100 kHz to 3 GHz to one of the substrate electrode and the facing electrode, to generate plasma in the vacuum chamber and thereby perform plasma processing of a substrate in the vacuum chamber.

18. A plasma processing apparatus comprising:
a vacuum chamber operable to maintain a vacuum therein;
a gas supply device for supplying a gas into said vacuum chamber;
an exhauster for exhausting the gas from said vacuum chamber;
a substrate electrode for supporting a substrate in said vacuum chamber;
a plasma source facing said substrate electrode;
a high-frequency power source for supplying high-frequency power having a frequency in a range of 100 kHz to 3 GHz to said plasma source; and
a dielectric tube having a gas supply hole formed therethrough, said dielectric tube being attached to a metal body fixed to said vacuum chamber, and being operable to allow the gas supplied to said vacuum chamber by said gas supply device to pass through said gas supply hole so as to enter said vacuum chamber, said plasma source being spaced apart from said dielectric tube.

19. The plasma processing apparatus of claim 18, wherein said plasma source comprises an antenna, further comprising a dielectric plate between said vacuum chamber and said antenna, said antenna and said dielectric plate being arranged so as to protrude into said vacuum chamber.

20. The plasma processing apparatus of claim 19, wherein said dielectric plate has a penetrating hole at a center thereof, said high-frequency power source being operable to supply high-frequency power to said antenna through said penetrating hole, said dielectric plate having through-holes formed therein and short pins inserted in said through-holes such that said short pins are arranged at approximately equal intervals around a center of said antenna and such that said antenna and said vacuum chamber are short-circuited by said short pins.

21. The plasma processing apparatus of claim 19, further comprising a circular and groove-shaped plasma trap between said antenna and said vacuum chamber, for controlling plasma distribution on the substrate.

22. The plasma processing apparatus of claim 21, wherein said metal body comprises a ring arranged to form said plasma trap between said ring and said antenna.

23. The plasma processing apparatus of claim 18, wherein said metal body comprises a ring forming a portion of a side wall of said vacuum chamber.

24. The plasma processing apparatus of claim 18, wherein said dielectric tube comprises a dielectric bolt screwed in a tap formed in one of said metal body and a facing electrode.

25. The plasma processing apparatus of claim 18, wherein said dielectric tube has a spot facing for a tool so that said dielectric tube can be rotated and screwed into one of said metal plate and a facing electrode by the tool.

26. The plasma processing apparatus of claim 18, wherein said dielectric tube protrudes by an amount in a range of 0.5 mm to 20 mm from a surface of one of said metal body and a facing electrode.

27. The plasma processing apparatus of claim 26, wherein said dielectric tube is formed so as to cover an edge of a hole in one of said metal body and said facing electrode, said dielectric tube being inserted in said hole.

28. The plasma processing apparatus of claim 18, wherein said dielectric tube protrudes by an amount in a range of 1 mm to 10 mm from a surface of one of said metal body and a facing electrode.

29. The plasma processing apparatus of claim 28, wherein said dielectric tube is formed so as to cover an edge of a hole in one of said metal body and said facing electrode, said dielectric tube being inserted in said hole.

30. The plasma processing apparatus of claim 18, wherein said gas supply hole through said dielectric tube has a diameter in a range of 0.2 mm to 2 mm.

31. The plasma processing apparatus of claim 18, wherein said gas supply hole through said dielectric tube has a diameter in a range of 0.4 mm to 0.8 mm.

32. The plasma processing apparatus of claim 18, wherein said high-frequency power source is operable to apply high-frequency power to one of said plasma source, said substrate electrode, and a facing electrode having a frequency in a range of 50 MHz to 3 GHz.

33. A plasma processing apparatus comprising:
a vacuum chamber operable to maintain a vacuum therein;
a gas supply device for supplying a gas into said vacuum chamber;
an exhauster for exhausting the gas from said vacuum chamber;
a substrate electrode for supporting a substrate in said vacuum chamber;

a facing electrode facing said substrate electrode;

a high-frequency power source for supplying high-frequency power having a frequency in a range of 100 kHz to 3 GHz to one of said substrate electrode and said facing electrode;

a dielectric tube having a gas supply hole formed therethrough, said dielectric tube being attached to a metal body fixed to said facing electrode, and being operable to allow the gas supplied to said vacuum chamber by said gas supply device to pass through said gas supply hole, said dielectric tube protruding by an amount in a range of 0.5 mm to 20 mm from a surface of one of said metal body and said facing electrode.

34. The plasma processing apparatus of claim 33, wherein said dielectric tube comprises a dielectric bolt screwed in a tap formed in one of said metal body and said facing electrode.

35. The plasma processing apparatus of claim 33, wherein said dielectric tube has a spot facing for a tool so that said dielectric tube can be rotated and screwed into one of said metal plate and said facing electrode by the tool.

36. The plasma processing apparatus of claim 33, wherein said dielectric tube protrudes by an amount in a range of 1 mm to 10 mm from a surface of one of said metal body and said facing electrode.

37. The plasma processing apparatus of claim 33, wherein said dielectric tube is formed so as to cover an edge of a hole in one of said metal body and said facing electrode, said dielectric tube being inserted in said hole.

38. The plasma processing apparatus of claim 33, wherein said gas supply hole through said dielectric tube has a diameter in a range of 0.2 mm to 2 mm.

39. The plasma processing apparatus of claim 33, wherein said gas supply hole through said dielectric tube has a diameter in a range of 0.4 mm to 0.8 mm.

40. The plasma processing apparatus of claim 33, wherein said high-frequency power source is operable to apply high-frequency power to one of said plasma source, said substrate electrode, and said facing electrode having a frequency in a range of 50 MHz to 3 GHz.

* * * * *